United States Patent
Nomura et al.

(10) Patent No.: US 11,605,715 B2
(45) Date of Patent: Mar. 14, 2023

(54) BIDIRECTIONAL SWITCH ELEMENT

(71) Applicant: PANASONIC INTELLECTUAL PROPERTY MANAGEMENT CO., LTD., Osaka (JP)

(72) Inventors: Masanori Nomura, Osaka (JP); Hiroaki Ueno, Osaka (JP); Yusuke Kinoshita, Kyoto (JP); Yasuhiro Yamada, Tokyo (JP); Hidetoshi Ishida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 198 days.

(21) Appl. No.: 17/256,475

(22) PCT Filed: Jun. 12, 2019

(86) PCT No.: PCT/JP2019/023188
§ 371 (c)(1),
(2) Date: Dec. 28, 2020

(87) PCT Pub. No.: WO2020/004021
PCT Pub. Date: Jan. 2, 2020

(65) Prior Publication Data
US 2021/0134963 A1 May 6, 2021

(30) Foreign Application Priority Data
Jun. 29, 2018 (JP) .............................. JP2018-125452

(51) Int. Cl.
*H01L 29/20* (2006.01)
*H01L 29/43* (2006.01)
(Continued)

(52) U.S. Cl.
CPC ........ *H01L 29/2003* (2013.01); *H01L 29/432* (2013.01); *H01L 29/7782* (2013.01); *H01L 29/808* (2013.01)

(58) Field of Classification Search
CPC combination set(s) only.
See application file for complete search history.

(56) References Cited

U.S. PATENT DOCUMENTS

| | | |
|---|---|---|
| 2001/0020700 A1 | 9/2001 | Inoue et al. |
| 2010/0097105 A1 | 4/2010 | Morita et al. |
| | | (Continued) |

FOREIGN PATENT DOCUMENTS

| | | |
|---|---|---|
| JP | 2001-196575 A | 7/2001 |
| JP | 2011-204993 A | 10/2011 |
| | (Continued) | |

OTHER PUBLICATIONS

International Search Report and Written Opinion issued in International Patent Application No. PCT/JP2019/023188, dated Aug. 20, 2019; with partial English translation.

*Primary Examiner* — Julio J Maldonado
*Assistant Examiner* — Mohammad A Rahman
(74) *Attorney, Agent, or Firm* — McDermott Will & Emery LLP

(57) ABSTRACT

A bidirectional switch element includes: a substrate; an $Al_zGa_{1-z}N$ layer; an $Al_bGa_{1-b}N$ layer; a first source electrode; a first gate electrode; a second gate electrode; a second source electrode; a p-type $Al_{x1}Ga_{1-x1}N$ layer; a p-type $Al_{x2}Ga_{1-x2}N$ layer; an $Al_yGa_{1-y}N$ layer; and an $Al_wGa_{1-w}N$ layer. The $Al_zGa_{1-z}N$ layer is formed over the substrate. The $Al_bGa_{1-b}N$ layer is formed on the $Al_zGa_{1-z}N$ layer. The $Al_yGa_{1-y}N$ layer is interposed between the substrate and the $Al_zGa_{1-z}N$ layer. The $Al_wGa_{1-w}N$ layer is interposed between (Continued)

the substrate and the $Al_yGa_{1-y}N$ layer and has a higher C concentration than the $Al_yGa_{1-y}N$ layer.

18 Claims, 7 Drawing Sheets

(51) Int. Cl.
*H01L 29/778* (2006.01)
*H01L 29/808* (2006.01)

(56) References Cited

U.S. PATENT DOCUMENTS

| | | | |
|---|---|---|---|
| 2012/0217542 A1* | 8/2012 | Morita | H01L 27/0605 257/140 |
| 2013/0009676 A1 | 1/2013 | Morita et al. | |
| 2013/0307023 A1 | 11/2013 | Kokawa et al. | |
| 2015/0171204 A1 | 6/2015 | Nakayama et al. | |
| 2016/0020313 A1 | 1/2016 | Wu et al. | |
| 2016/0190298 A1 | 6/2016 | Wu et al. | |
| 2017/0162683 A1 | 6/2017 | Nakayama et al. | |

FOREIGN PATENT DOCUMENTS

| | | |
|---|---|---|
| JP | 2012-243871 A | 12/2012 |
| JP | 2015-115582 A | 6/2015 |
| JP | 2017-521869 A | 8/2017 |
| WO | 2008/062800 A1 | 5/2008 |

* cited by examiner

BIDIRECTIONAL SWITCH ELEMENT

CROSS-REFERENCE OF RELATED APPLICATIONS

This application is the U.S. National Phase under 35 U.S.C. § 371 of International Patent Application No. PCT/JP2019/023188, filed on Jun. 12, 2019, which in turn claims the benefit of Japanese Application No. 2018-125452, filed on Jun. 29, 2018, the entire disclosures of which Applications are incorporated by reference herein.

TECHNICAL FIELD

The present disclosure generally relates to a bidirectional switch element, and more particularly relates to a bidirectional switch element including two gate electrodes.

BACKGROUND ART

A bidirectional switch element, which is a double-gate (also called "dual-gate") semiconductor element, has been proposed in the art (see Patent Literature 1).

In the bidirectional switch element of Patent Literature 1, a semiconductor multilayer structure is formed over an electrically conductive substrate of silicon with a buffer layer of AlN interposed between the substrate and the multilayer structure. In the semiconductor multilayer structure, a first layer of undoped GaN (GaN layer) and a second layer of undoped AlGaN (first AlGaN layer) are stacked in this order from the bottom.

A channel region as a two-dimensional electron gas layer is generated in the vicinity of a heterojunction between the first layer and the second layer.

On the semiconductor multilayer structure, a first ohmic electrode (first source electrode) and a second ohmic electrode (second source electrode) are arranged to be spaced apart from each other. In a region between the first and second ohmic electrodes on the semiconductor multilayer structure, a first gate electrode, formed over the semiconductor multilayer structure with a first p-type nitride semiconductor layer interposed, and a second gate electrode, formed over the semiconductor multilayer structure with a second p-type nitride semiconductor layer interposed, are arranged side by side from the first ohmic electrode toward the second ohmic electrode.

When used with its substrate electrically floating, for example, the bidirectional switch element of Patent Literature 1 may produce a current collapse that causes an increase in its ON-state resistance at the time of switching. As used herein, the "current collapse" is a phenomenon that causes an increase in ON-state resistance due to trapping of electrons in the vicinity of a channel (such as crystals and interfaces) when high voltage is applied to the switch element.

CITATION LIST

Patent Literature

Patent Literature 1: JP 2011-204993 A

SUMMARY OF INVENTION

It is therefore an object of the present disclosure to provide a bidirectional switch element with the ability to reduce the current collapse.

Solution to Problem

A bidirectional switch element according to an aspect of the present disclosure includes: a substrate; an $Al_zGa_{1-z}N$ layer (where $0 \le z < 1$); an $Al_bGa_{1-b}N$ layer (where $0 < b < 1$); a first source electrode; a first gate electrode; a second gate electrode; a second source electrode; a p-type $Al_{x1}Ga_{1-x1}N$ layer (where $0 \le x1 \le 1$); a p-type $Al_{x2}Ga_{1-x2}N$ layer (where $0 \le x2 \le 1$); an $Al_yGa_{1-y}N$ layer (where $0 < y < 1$ and $z < y < b$); and an $Al_wGa_{1-w}N$ layer (where $0 < w < 1$ and $z < w < b$). The $Al_zGa_{1-z}N$ layer is formed over the substrate. The $Al_bGa_{1-b}N$ layer is formed on the $Al_zGa_{1-z}N$ layer. The first source electrode, the first gate electrode, the second gate electrode, and the second source electrode are formed on the $Al_bGa_{1-b}N$ layer. The p-type $Al_{x1}Ga_{1-x1}N$ layer is interposed between the first gate electrode and the $Al_bGa_{1-b}N$ layer. The p-type $Al_{x2}Ga_{1-x2}N$ layer is interposed between the second gate electrode and the $Al_bGa_{1-b}N$ layer. The $Al_yGa_{1-y}N$ layer is interposed between the substrate and the $Al_zGa_{1-z}N$ layer. The $Al_wGa_{1-w}N$ layer is interposed between the substrate and the $Al_yGa_{1-y}N$ layer. The $Al_wGa_{1-w}N$ layer has a higher C concentration than the $Al_yGa_{1-y}N$ layer.

DESCRIPTION OF EMBODIMENTS

FIGS. 1, 3, 5, and 7 to be referred to in the following description of embodiments are all schematic representations. That is to say, the ratio of the dimensions (including thicknesses) of respective constituent elements illustrated in FIGS. 1, 3, 5, and 7 does not always reflect their actual dimensional ratio.

First Embodiment

Figure 1:
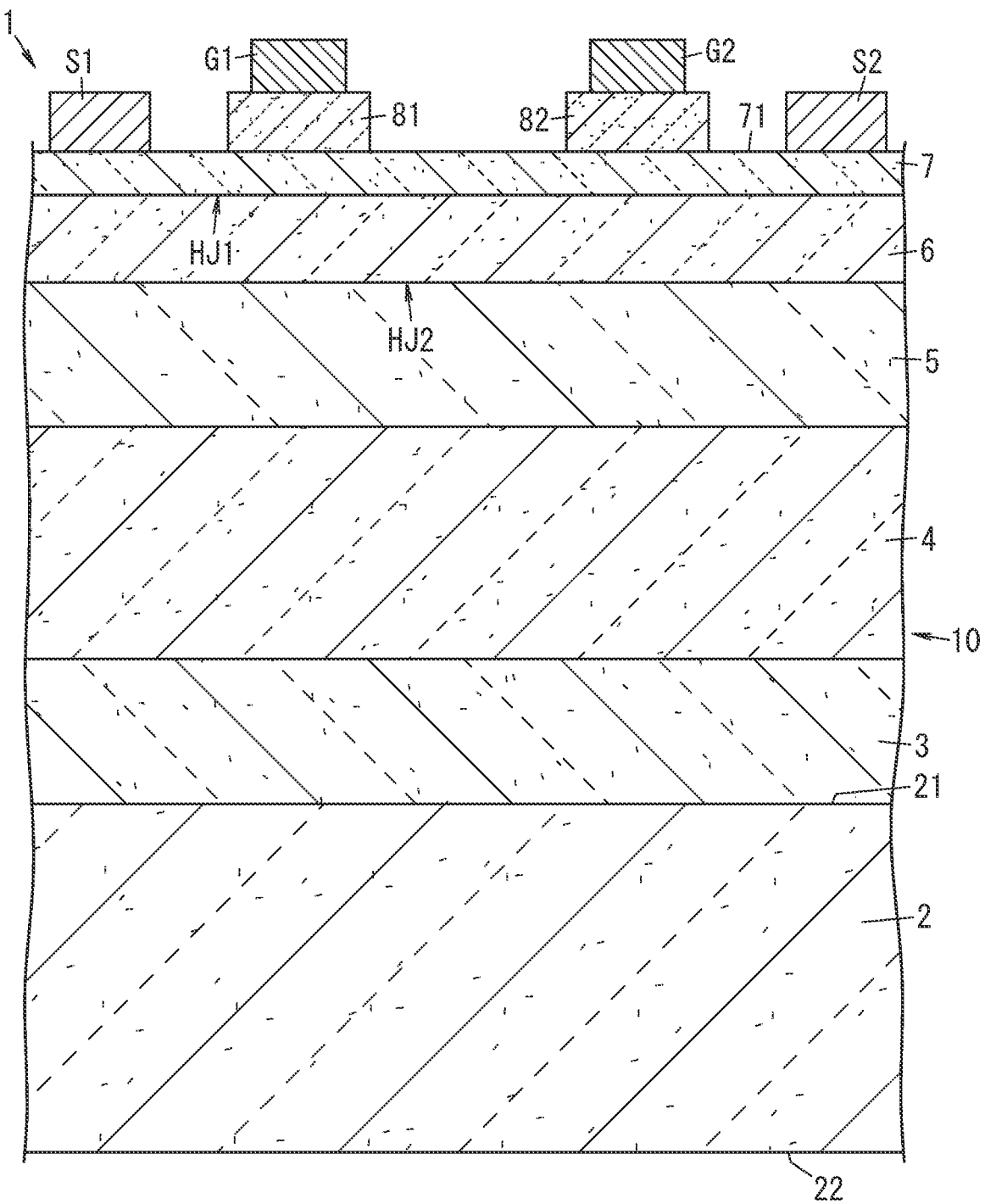
FIG. 1 is a cross-sectional view of a bidirectional switch element according to a first embodiment.

A bidirectional switch element 1 according to a first embodiment will be described with reference to FIG. 1.

The bidirectional switch element 1 may be used in, for example, a power converter such as a matrix converter for performing AC-AC power conversion. However, this is only an example of the present disclosure and should not be construed as limiting. Alternatively, the bidirectional switch element 1 may also be used in a relay or as an AC switch of a dimmer for light fixtures, for example. The bidirectional switch element 1 may be implemented as, for example, a dual-gate type GaN-based gate injection transistor (GIT).

The bidirectional switch element 1 includes a substrate 2, a GaN layer 6, a first AlGaN layer 7, a first source electrode S1, a first gate electrode G1, a second gate electrode G2, a second source electrode S2, a first p-type AlGaN layer 81, and a second p-type AlGaN layer 82.

The GaN layer 6 is formed over the substrate 2. The first AlGaN layer 7 is formed on the GaN layer 6 and forms, along with the GaN layer 6, a first heterojunction HJ1. In a region, located near the first heterojunction HJ1, of the GaN layer 6, a two-dimensional electron gas has been produced. The region including the two-dimensional electron gas (hereinafter also referred to as a "two-dimensional electron gas layer") may serve as an n-channel layer (electron conduction layer).

The first source electrode S1 is formed on the first AlGaN layer 7. The first gate electrode G1 is formed over the first AlGaN layer 7. The second gate electrode G2 is formed over the first AlGaN layer 7 to be located opposite from the first source electrode S1 with respect to the first gate electrode G1. The second source electrode S2 is formed on the first AlGaN layer 7 to be located opposite from the first gate electrode G1 with respect to the second gate electrode G2. In this embodiment, in the bidirectional switch element 1, the first source electrode S, the first gate electrode G1, the second gate electrode G2, and the second source electrode S2 are arranged side by side in this order in one direction along a surface 71 of the first AlGaN layer 7. The first source electrode S1, the first gate electrode G1, the second gate electrode G2, and the second source electrode S2 are spaced apart from each other in the one direction.

The bidirectional switch element 1 is a normally OFF bidirectional switch element and includes the first p-type AlGaN layer 81 and the second p-type AlGaN layer 82 as described above. The first p-type AlGaN layer 81 is interposed between the first gate electrode G1 and the first AlGaN layer 7. The second p-type AlGaN layer 82 is interposed between the second gate electrode G2 and the first AlGaN layer 7.

In the following description, a state where no voltage equal to or higher than a first threshold voltage is applied between the first gate electrode G1 and the first source electrode S1 will be hereinafter referred to as a state where the first gate electrode G1 is OFF for the sake of convenience. On the other hand, a state where a voltage equal to or higher than the first threshold voltage is applied between the first gate electrode G1 and the first source electrode S1 with the first gate electrode G having the higher potential will be hereinafter referred to as a state where the first gate electrode G1 is ON. Also, a state where no voltage equal to or higher than a second threshold voltage is applied between the second gate electrode G2 and the second source electrode S2 will be hereinafter referred to as a state where the second gate electrode G2 is OFF. On the other hand, a state where a voltage equal to or higher than the second threshold voltage is applied between the second gate electrode G2 and the second source electrode S2 with the second gate electrode G2 having the higher potential will be hereinafter referred to as a state where the second gate electrode G2 is ON.

This bidirectional switch element 1 includes the first p-type AlGaN layer 81 and the second p-type AlGaN layer 82, thereby operating as a normally OFF transistor. In this case, when the first gate electrode G1 is OFF, the first p-type AlGaN layer 81 forms a depletion layer right under the first p-type AlGaN layer 81 such that the depletion layer runs through the first AlGaN layer 7 to reach the GaN layer 6. When the second gate electrode G2 is OFF, the second p-type AlGaN layer 82 forms a depletion layer right under the second p-type AlGaN layer 82 such that the depletion layer runs through the first AlGaN layer 7 to reach the GaN layer 6. In the state where the first gate electrode G1 is ON, the bidirectional switch element 1 may connect the first gate electrode G1 and the first source electrode S1 with the two-dimensional electron gas (i.e., prevent the depletion layer from shutting off the two-dimensional electron gas between the first gate electrode G1 and the first source electrode S1). In addition, in the state where the second gate electrode G2 is ON, the bidirectional switch element 1 may connect the second gate electrode G2 and the second source electrode S2 with the two-dimensional electron gas (i.e., prevent the depletion layer from shutting off the two-dimensional electron gas between the second gate electrode G2 and the second source electrode S2).

In a state where the first gate electrode G is OFF and the second gate electrode G2 is OFF (i.e., in a first operation mode), the bidirectional switch element 1 allows no current to flow in any direction between the first source electrode S1 and the second source electrode S2. More specifically, in the first operation mode, a current flowing from the first source electrode S1 toward the second source electrode S2 is cut off when the first source electrode S1 has a higher potential than the second source electrode S2 and a current flowing from the second source electrode S2 toward the first source electrode S is also cut off when the second source electrode S2 has a higher potential than the first source electrode S1.

In a state where the first gate electrode G1 is ON and the second gate electrode G2 is ON (i.e., in a second operation mode), the bidirectional switch element 1 allows a current to flow bidirectionally between the first source electrode S1 and the second source electrode S2. More specifically, in the second operation mode, a current flows from the first source electrode S1 toward the second source electrode S2 when the first source electrode S1 has a higher potential than the second source electrode S2 and a current flows from the second source electrode S2 toward the first source electrode S1 when the second source electrode S2 has a higher potential than the first source electrode S1.

In a state where the first gate electrode G1 is ON and the second gate electrode G2 is OFF (i.e., in a third operation mode), the bidirectional switch element 1 serves as a diode. More specifically, in the third operation mode, a current flowing from the first source electrode S1 toward the second source electrode S2 is cut off when the first source electrode S1 has a higher potential than the second source electrode S2 and a current flows from the second source electrode S2 toward the first source electrode S1 when the second source electrode S2 has a higher potential than the first source electrode S1 by at least the second threshold voltage.

In a state where the first gate electrode G is OFF and the second gate electrode G2 is ON (i.e., in a fourth operation mode), the bidirectional switch element 1 serves as a diode. More specifically, in the fourth operation mode, a current flowing from the second source electrode S2 toward the first source electrode S1 is cut off when the second source electrode S2 has a higher potential than the first source electrode S1 and a current flows from the first source electrode S1 toward the second source electrode S2 when the first source electrode S1 has a higher potential than the second source electrode S2 by at least the first threshold voltage.

In this bidirectional switch element 1, the first threshold voltage and the second threshold voltage have the same value. However, this is only an example of the present disclosure and should not be construed as limiting. Alternatively, the first threshold voltage and the second threshold voltage may mutually different values.

The bidirectional switch element 1 further includes a second AlGaN layer 5 and a third AlGaN layer 4. The second AlGaN layer 5 is provided between the substrate 2 and the GaN layer 6 and forms, along with the GaN layer 6, a second heterojunction HJ2. The third AlGaN layer 4 is provided between the substrate 2 and the second AlGaN layer 5.

The bidirectional switch element 1 further includes a buffer layer 3 provided between the substrate 2 and the third AlGaN layer 4. Thus, the bidirectional switch element 1 has a multilayer stack 10 including the buffer layer 3, the third AlGaN layer 4, the second AlGaN layer 5, the GaN layer 6, the first AlGaN layer 7, the first p-type AlGaN layer 81, and the second p-type AlGaN layer 82.

When viewed in plan along the thickness of the bidirectional switch element 1, the bidirectional switch element 1 may have a square outer peripheral shape. However, the outer peripheral shape of the bidirectional switch element 1 does not have to be a square shape but may be, for example, a rectangular shape as well.

Next, respective constituent elements of the bidirectional switch element 1 will be described in further detail.

The substrate 2 is a silicon substrate. Thus, the substrate 2 is a type of electrically conductive substrate. The substrate 2 has a first principal surface 21 and a second principal surface 22. The first principal surface 21 and second principal surface 22 of the substrate 2 are perpendicular to the thickness direction defined for the substrate 2. As used herein, if these surfaces are "perpendicular to" the thickness direction, the surfaces may naturally be exactly perpendicular to the thickness direction but may also be substantially perpendicular to the thickness direction (e.g., when the angle formed between the thickness direction and the first or second principal surface 21, 22 is 90±5 degrees). The second principal surface 22 is located opposite from the first principal surface 21 in the thickness direction defined for the substrate 2. In the bidirectional switch element 1, the multilayer stack 10 is formed on the first principal surface 21 of the substrate 2. The first principal surface 21 of the substrate 2 may be a (111) plane, for example.

Alternatively, the first principal surface 21 of the substrate 2 may also be a crystallographic plane, of which an off-axis angle with respect to the (111) plane (hereinafter referred to as a "first off-axis angle") is greater than 0 degrees and equal to or less than 5 degrees. As used herein, the "first off-axis angle" indicates a tilt angle defined by the first principal surface 21 with respect to the (111) plane. Thus, if the off-axis angle is 0 degrees, then the first principal surface 21 is a (111) plane. The (111) plane is a crystallographic plane represented by three Miller indices enclosed in parentheses. The substrate 2 may have a thickness of 100 µm to 100 µm, for example.

The multilayer stack 10 includes the buffer layer 3, the third AlGaN layer 4, the second AlGaN layer 5, the GaN layer 6, and the first AlGaN layer 7 as described above. In the multilayer stack 10, the buffer layer 3, the third AlGaN layer 4, the second AlGaN layer 5, the GaN layer 6, and the first AlGaN layer 7 are arranged in this order from the substrate 2 toward the first AlGaN layer 7. The buffer layer 3 is formed directly on the substrate 2. The third AlGaN layer 4 is formed directly on the buffer layer 3. The second AlGaN layer 5 is formed directly on the third AlGaN layer 4. The GaN layer 6 is formed directly on the second AlGaN layer 5. The first AlGaN layer 7 is formed directly on the GaN layer 6. The multilayer stack 10 further includes the first p-type AlGaN layer 81 and the second p-type AlGaN layer 82 which are formed directly on the first AlGaN layer 7.

The multilayer stack 10 includes epitaxially grown layers grown on the substrate 2 by metalorganic vapor phase epitaxy (MOVPE), for example. When an MOVPE system is used as an epitaxial growth system for growing the multilayer stack 10 on the substrate 2, trimethylaluminum (TMA) is suitably used as an Al source gas, trimethylgallium (TMGa) is suitably used as a Ga source gas, and $NH_3$ is suitably used as an N source gas. As a source gas for Mg, which is a dopant imparting p-type conductivity, bis(cyclopentadienyl)magnesium ($Cp_2Mg$) is suitably used. A carrier gas for the respective source gases is suitably an $H_2$ gas, for example. The source gases are not particularly limited to the ones exemplified above. Alternatively, triethylgallium (TEGa) may also be used as a Ga source gas, and a hydrazine derivative may also be used as an N source gas, for example.

The buffer layer 3 may be an undoped GaN layer, for example. The buffer layer 3 is provided for the purpose of improving the crystallinity of the third AlGaN layer 4, the second AlGaN layer 5, the GaN layer 6, the first AlGaN layer 7, the first p-type AlGaN layer 81, and the second p-type AlGaN layer 82. The buffer layer 3 is formed directly on the first principal surface 21 of the substrate 2. The undoped GaN layer serving as the buffer layer 3 may include Mg, H, Si, C, O, and other impurities to be inevitably contained therein during its growth. The buffer layer 3 may have a thickness of 100 nm to 3000 nm, for example.

The GaN layer 6 is an undoped GaN layer. The undoped GaN layer serving as the GaN layer 6 may include Mg, H, Si, C, O, and other impurities to be inevitably contained therein during its growth. The GaN layer 6 may have a thickness of 100 nm to 700 nm, for example.

The first AlGaN layer 7 is an undoped AlGaN layer and forms, along with the GaN layer 6, the first heterojunction HJ1 as described above. In the GaN layer 6, a two-dimensional electron gas has been produced in a region in the vicinity of the first heterojunction HJ1. The undoped AlGaN layer serving as the first AlGaN layer 7 may include Mg, H, Si, C, O, and other impurities to be inevitably contained therein during its growth. The undoped AlGaN layer serving as the first AlGaN layer 7 may have an Al composition ratio of 0.20, for example. As used herein, the "Al composition ratio" refers to an x value when an AlGaN layer is expressed by the general formula $Al_xGa_{1-x}N$. That is to say, the first AlGaN layer 7 is an undoped $Al_{0.20}Ga_{0.80}N$ layer. The composition ratio may be a value obtained by composition analysis according to energy dispersive X-ray spectroscopy (EDX). When their magnitudes are discussed, the composition ratios do not have to be values obtained by the EDX but may also be values obtained by composition analysis according to Auger electron spectroscopy or composition analysis according to SIMS, for example. In the bidirectional switch element 1 according to the first embodiment, the GaN layer 6, the first AlGaN layer 7, the first p-type AlGaN layer 81, the second p-type AlGaN layer 82, the second AlGaN layer 5, and the third AlGaN layer 4 are examples of the $Al_zGa_{1-z}N$ layer (where $0 \leq z < 1$), the $Al_bGa_{1-b}N$ layer (where $0 < b < 1$), the p-type $Al_{x1}Ga_{1-x1}N$ layer (where $0 \leq x1 \leq 1$), the p-type $Al_{x2}Ga_{1-x2}N$ layer (where $0 \leq x2 \leq 1$), the $Al_yGa_{1-y}N$ layer (where $0<y<1$ and $z<y<b$), and the $Al_wGa_{1-w}N$ layer (where $0<w<1$ and $z<w<b$), respectively.

The first AlGaN layer 7 may have a thickness of 10 nm to 100 nm, for example.

The first p-type AlGaN layer 81 and the second p-type AlGaN layer 82 each cover only a part of the surface 71 of the first AlGaN layer 7. Thus, the surface 71 of the first AlGaN layer 7 includes regions covered with the first p-type AlGaN layer 81 and the second p-type AlGaN layer 82 and regions covered with neither the first p-type AlGaN layer 81 nor the second p-type AlGaN layer 82. The first p-type AlGaN layer 81 and the second p-type AlGaN layer 82 are spaced apart from each other. The first p-type AlGaN layer 81 and the second p-type AlGaN layer 82 are doped with Mg during their growth and contain Mg. The first p-type AlGaN layer 81 and the second p-type AlGaN layer 82 are formed by growing, using an MOVPE system, a p-type AlGaN layer as a prototype of the first p-type AlGaN layer 81 and the second p-type AlGaN layer 82 on the first AlGaN layer 7 and then patterning the p-type AlGaN layer by photolithographic and etching techniques.

The Al composition ratio of the first p-type AlGaN layer 81 is the same as the Al composition ratio of the second p-type AlGaN layer 82. The Al composition ratio of the first p-type AlGaN layer 81 and second p-type AlGaN layer 82 may be the same as the Al composition ratio of the first AlGaN layer 7 (and may be 0.20, for example). However, the Al composition ratio of the first p-type AlGaN layer 81 and second p-type AlGaN layer 82 may be different from that of the first AlGaN layer 7. The first p-type AlGaN layer 81 and the second p-type AlGaN layer 82 may have a thickness of 50 nm to 300 nm, for example.

The first source electrode S1 and the second source electrode S2 are formed in regions, covered with neither the first p-type AlGaN layer 81 nor the second p-type AlGaN layer 82, of the surface 71 of the first AlGaN layer 7. The first source electrode S1 and the second source electrode S2 are spaced apart from each other. The first source electrode S1 and the second source electrode S2 are electrically connected to the first heterojunction HJ1. As used herein, if two members are "electrically connected together," then it means that the two members are in ohmic contact with each other. The first source electrode S1 and the second source electrode S2 may each contain Ti and Al, for example.

The first gate electrode G1 is formed over the first AlGaN layer 7 with the first p-type AlGaN layer 81 interposed between the first gate electrode G1 and the first AlGaN layer 7. The second gate electrode G2 is formed over the first AlGaN layer 7 with the second p-type AlGaN layer 82 interposed between the second gate electrode G2 and the first AlGaN layer 7. The interval between the first gate electrode G1 and the second gate electrode G2 is longer than the interval between the first p-type AlGaN layer 81 and the second p-type AlGaN layer 82. Each of the first gate electrode G1 and the second gate electrode G2 is spaced from an associated one of the first source electrode S1 and second source electrode S2 in the direction along the surface 71 of the first AlGaN layer 7. The first gate electrode G1 and second gate electrode G2 may be in ohmic contact with the first p-type AlGaN layer 81 and the second p-type AlGaN layer 82, respectively. Each of the first gate electrode G1 and the second gate electrode G2 contains Pd and Au, for example.

The second AlGaN layer 5 forms, along with the GaN layer 6, the second heterojunction HJ2 as described above. The second AlGaN layer 5 is located opposite from the first AlGaN layer 7 in the thickness direction defined for the GaN layer 6. In other words, the second AlGaN layer 5 faces the first AlGaN layer 7 with the GaN layer 6 interposed between the second AlGaN layer 5 and the first AlGaN layer 7. Thus, the bidirectional switch element 1 has a double heterostructure including the first AlGaN layer 7, the GaN layer 6, and the second AlGaN layer 5. The bandgap of each of the first AlGaN layer 7 and the second AlGaN layer 5 is larger than the bandgap of the GaN layer 6.

The second AlGaN layer 5 is an undoped AlGaN layer. The undoped AlGaN layer serving as the second AlGaN layer 5 may include Mg, H, Si, C, O, and other impurities to be inevitably contained therein during its growth. The Al composition ratio of the second AlGaN layer 5 (i.e., the Al composition ratio y of an $Al_yGa_{1-y}N$ layer corresponding to the second AlGaN layer 5) may be 0.02, for example. That is to say, the second AlGaN layer 5 is an undoped $Al_{0.02}Ga_{0.98}N$ layer. The $Al_yGa_{1-y}N$ layer serving as the second AlGaN layer 5 may have a C concentration of $7 \times 10^{16}$ $cm^{-3}$. However, this numerical value is only an example and should not be construed as limiting. The C concentration of the $Al_yGa_{1-y}N$ layer is suitably equal to or less than $3 \times 10^{17}$ $cm^{-3}$. The C concentration is a value measured by secondary ion mass spectroscopy (SIMS). The second AlGaN layer 5 may have a thickness of 100 nm to 500 μm, for example.

The third AlGaN layer 4 is provided between the substrate 2 and the second AlGaN layer 5. The Al composition ratio of the third AlGaN layer 4 (i.e., the Al composition ratio w of an $Al_wGa_{1-w}N$ layer corresponding to the third AlGaN layer 4) is suitably equal to the Al composition ratio of the second AlGaN layer 5 (i.e., the composition ratio y of the $Al_yGa_{1-y}N$ layer corresponding to the second AlGaN layer 5) and may be 0.02, for example. That is to say, the third AlGaN layer 4 is an $Al_{0.02}Ga_{0.98}N$ layer. The third AlGaN layer 4 has a higher C concentration than the second AlGaN layer 5. The third AlGaN layer 4 may have a C concentration falling within the range from $5 \times 10^{18}$ $cm^{-3}$ to $5 \times 10^{19}$ $cm^{-3}$, for example. The third AlGaN layer 4 is doped intentionally with C during its growth. More specifically, the C concentration of the third AlGaN layer 4 is made higher than the C concentration of the second AlGaN layer 5 by setting the condition for growing the third AlGaN layer 4 such that a growth rate of the third AlGaN layer 4 becomes higher than a growth rate of the second AlGaN layer 5. In this case, the third AlGaN layer 4 achieves a higher degree of electrical insulation than the second AlGaN layer 5 and functions as an electrical insulating layer. This reduces the chances of a current flowing through the GaN layer 6 in the thickness direction. In this case, the condition for growing the third AlGaN layer 4 and the condition for growing the second AlGaN layer 5 may be set by appropriately adjusting the substrate temperature, the V/III ratio, the flow rates of respective source gases, the growth pressure, and other parameters. As used herein, the "substrate temperature" may be replaced with the temperature of a susceptor supporting a wafer to be diced into the substrates 2. For example, the substrate temperature may be replaced with the temperature, measured with a thermocouple, of the susceptor. As used herein, the "V/III ratio" refers to the ratio of the molar flow rate [μmol/min] of a source gas of a Group V element to the molar flow rate [μmol/min] of a source gas of a Group III element. The "growth pressure" refers herein to the pressure in a reaction furnace in a state where the respective source gases and carrier gases are being supplied into the reaction furnace of the MOVPE system.

The third AlGaN layer 4 suitably has a greater thickness than the second AlGaN layer 5. This allows the bidirectional switch element 1 to have an even higher breakdown voltage. The third AlGaN layer 4 may have a thickness of 600 nm to 3000 nm, for example.

The present inventors evaluated a variation in ON-state resistance (Ron) with time when the bidirectional switch element 1 according to the first embodiment was turned ON in a state where the substrate 2 was electrically floating. As used herein, the "state where the substrate 2 is electrically floating" refers to a state where substrate 2 is electrically insulated from all of the first source electrode S, the second source electrode S2, the first gate electrode G1, and the second gate electrode G2.

In addition, the present inventors also evaluated a variation in ON-state resistance with time when a bidirectional switch element according to a comparative example for the bidirectional switch element 1 according to the first embodiment was turned ON in a state where the substrate was floating. The bidirectional switch element according to the comparative example does not include the second AlGaN layer 5 of the bidirectional switch element 1 according to the first embodiment. The bidirectional switch element according to the comparative example includes, instead of the GaN layer 6 of the bidirectional switch element 1 according to the first embodiment, a first GaN layer, of which the thickness is equal to the sum of the thickness of the GaN layer 6 and the thickness of the second AlGaN layer 5, and also includes, instead of the third AlGaN layer 4 having a higher C concentration than the second AlGaN layer 5, a second GaN layer having a higher C concentration than the first GaN layer. The first GaN layer is an undoped GaN layer. That is to say, the bidirectional switch element according to the comparative example adopts a single heterostructure instead of the double heterostructure of the bidirectional switch element 1 according to the first embodiment.

The present inventors evaluated the variation in ON-state resistance with time by the ON-state resistance-time characteristic when the current value of a current flowing through the bidirectional switch element 1 according to the first embodiment and the current value of a current flowing through a bidirectional switch element according to the comparative example were both supposed to be 10 A. Supposing the voltage of the DC power supply connected between both terminals (i.e., between the first source electrode S1 and the second source electrode S2) of the bidirectional switch element 1 and both terminals of the bidirectional switch element according to the comparative example is Vdd, the ON-state resistance is calculated by Vdd/10 in accordance with Ohm's law. Regarding the bidirectional switch element 1, the ON-state resistance thereof when no current collapse was produced before the bidirectional switch element 1 was switched was 30 mΩ.

In the bidirectional switch element according to the comparative example, as Vdd increased, the ON-state resistance also increased accordingly, which revealed that a current collapse had been produced. Meanwhile, in the bidirectional switch element 1 according to the first embodiment, as Vdd increased, the ON-state resistance did not increase as much as in the bidirectional switch element according to the comparative example. This reveals that the current collapse was reduced in the bidirectional switch element 1 according to the first embodiment.

Figure 2A:
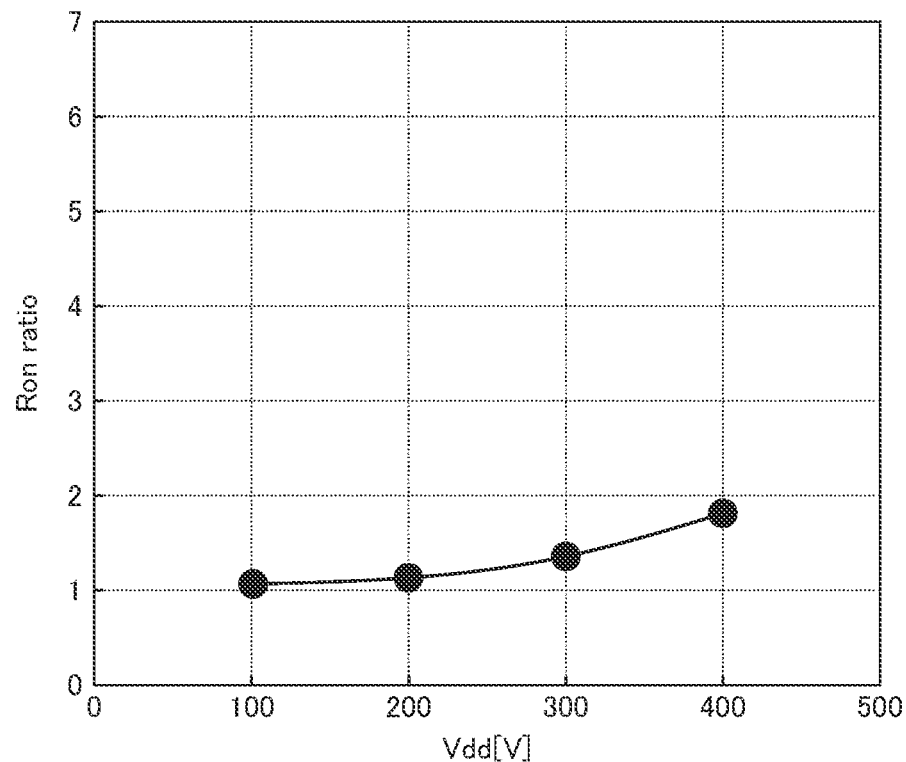
FIG. 2A is a graph showing an ON-state resistance ratio-voltage characteristic of the bidirectional switch element according to the first embodiment.
Figure 2B:
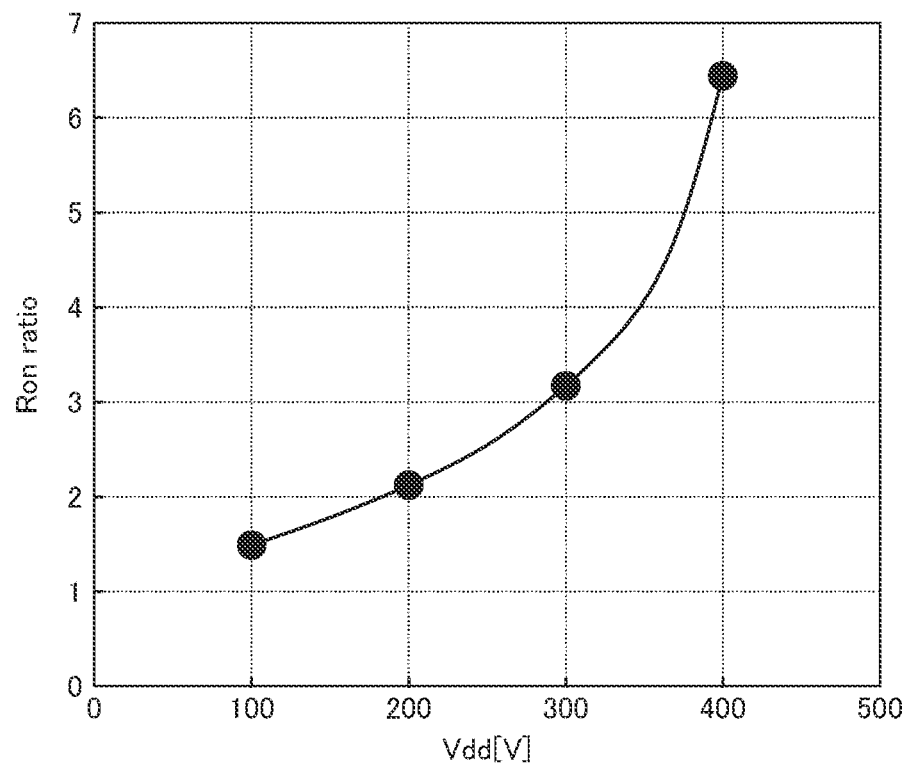
FIG. 2B is a graph showing an ON-state resistance ratio-voltage characteristic of a bidirectional switch element according to a comparative example.

FIGS. 2A and 2B show a relationship between an ON-state resistance ratio (on the supposition that the ON-state resistance when no current collapse is produced is one; in other words, normalized ON-state resistance) and Vdd in the bidirectional switch element 1 according to the first embodiment and the bidirectional switch element according to the comparative example, respectively. Each of FIGS. 2A and 2B shows a relationship between the ON-state resistance ratio and Vdd in a state where the substrate 2 is electrically floating.

As can be seen from FIGS. 2A and 2B, as Vdd increases, the ON-state resistance does not increase as much in the bidirectional switch element 1 according to the first embodiment as in the bidirectional switch element according to the comparative example.

The bidirectional switch element 1 according to the first embodiment includes the substrate 2, the GaN layer 6, the first AlGaN layer 7, the first source electrode S1, the first gate electrode G1, the second gate electrode G2, the second source electrode S2, the first p-type AlGaN layer 81, the second p-type AlGaN layer 82, the second AlGaN layer 5, and the third AlGaN layer 4. The GaN layer 6 is formed over the substrate 2. The first AlGaN layer 7 layer is formed on the GaN layer 6. The first source electrode S1, the first gate electrode G1, the second gate electrode G2, and the second source electrode S2 are formed on the first AlGaN layer 7. The first p-type AlGaN layer 81 is interposed between the first gate electrode G1 and the first AlGaN layer 7. The second p-type AlGaN layer 82 is interposed between the second gate electrode G2 and the first AlGaN layer 7. The second AlGaN layer 5 is interposed between the substrate 2 and the GaN layer 6. The third AlGaN layer 4 is interposed between the substrate 2 and the second AlGaN layer 5 and has a higher C concentration than the second AlGaN layer 5.

The bidirectional switch element 1 according to the first embodiment, including the second AlGaN layer 5 and the third AlGaN layer 4, may reduce a current collapse.

Figure 3:
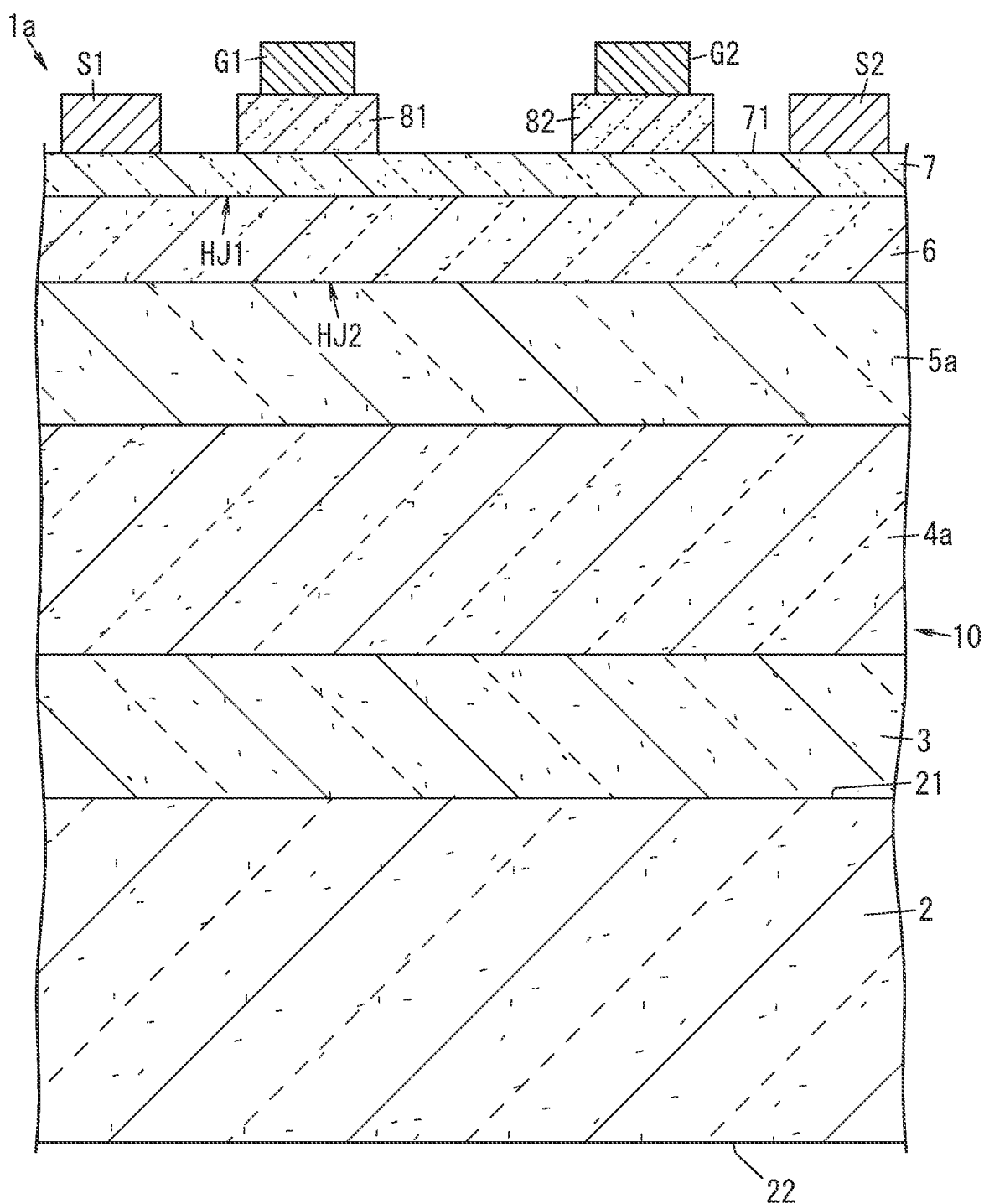
FIG. 3 is a cross-sectional view of a bidirectional switch element according to a variation of the first embodiment.

FIG. 3 is a cross-sectional view of a bidirectional switch element 1a according to a variation of the first embodiment. In the following description, any constituent element of the bidirectional switch element 1a according to this variation, having the same function as a counterpart of the bidirectional switch element 1 according to the first embodiment described above, will be designated by the same reference numeral as that counterpart's, and description thereof will be omitted herein.

The bidirectional switch element 1a according to this variation includes a third AlGaN layer 4a and a second AlGaN layer 5a instead of the third AlGaN layer 4 and second AlGaN layer 5 of the bidirectional switch element 1 according to the first embodiment. The third AlGaN layer 4a is an undoped AlGaN layer. The Al composition ratio of the third AlGaN layer 4a is 0.05. That is to say, the third AlGaN layer 4a is an undoped $Al_{0.05}Ga_{0.85}N$ layer. Also, the Al composition ratio of the third AlGaN layer 4a is equal to the Al composition ratio of the third AlGaN layer 4a and is 0.05.

The second AlGaN layer 5a is provided between the substrate 2 and the GaN layer 6, and forms, along with the GaN layer 6, a second heterojunction HJ2. The third AlGaN layer 4a is located between the substrate 2 and the second AlGaN layer 5a and has a higher C concentration than the second AlGaN layer 5a. The undoped AlGaN layer serving as the second AlGaN layer 5a may have a C concentration of $7 \times 10^{16}$ $cm^{-3}$, for example. The third AlGaN layer 4a may have a C concentration falling within the range from $5 \times 10^{18}$ $cm^{-3}$ to $5 \times 10^{19}$ $cm^{-3}$, for example. In the bidirectional switch element 1a according to this variation of the first embodiment, the GaN layer 6, the first AlGaN layer 7, the first p-type AlGaN layer 81, the second p-type AlGaN layer 82, the second AlGaN layer 5a, and the third AlGaN layer 4a are examples of the $Al_zGa_{1-z}N$ layer (where $0 \leq z < 1$), the $Al_bGa_{1-b}N$ layer (where $0 < b < 1$), the p-type $Al_{x1}Ga_{1-x1}N$ layer (where $0 \leq x1 \leq 1$), the p-type $Al_{x2}Ga_{1-x2}N$ layer (where $0 \leq x2 \leq 1$), the $Al_yGa_{1-y}N$ layer (where $0<y<1$ and $z<y<b$), and the $Al_wGa_{1-w}N$ layer (where $0<w<1$ and $z<w<b$), respectively.

The bidirectional switch element 1a according to this variation, as well as the bidirectional switch element 1 according to the first embodiment, may reduce the current collapse.

In this case, in the bidirectional switch element 1 according to this variation, the OFF-state leakage current increases compared to the bidirectional switch element according to the comparative example. In contrast, the bidirectional switch element 1 according to the first embodiment may reduce the OFF-state leakage current compared to the bidirectional switch element according to the variation. As used herein, the "OFF-state leakage current" refers to a current flowing from the second source electrode S2 toward the first source electrode S1 when the first gate electrode G1 is OFF and the second gate electrode G2 is also OFF.

Figure 4:
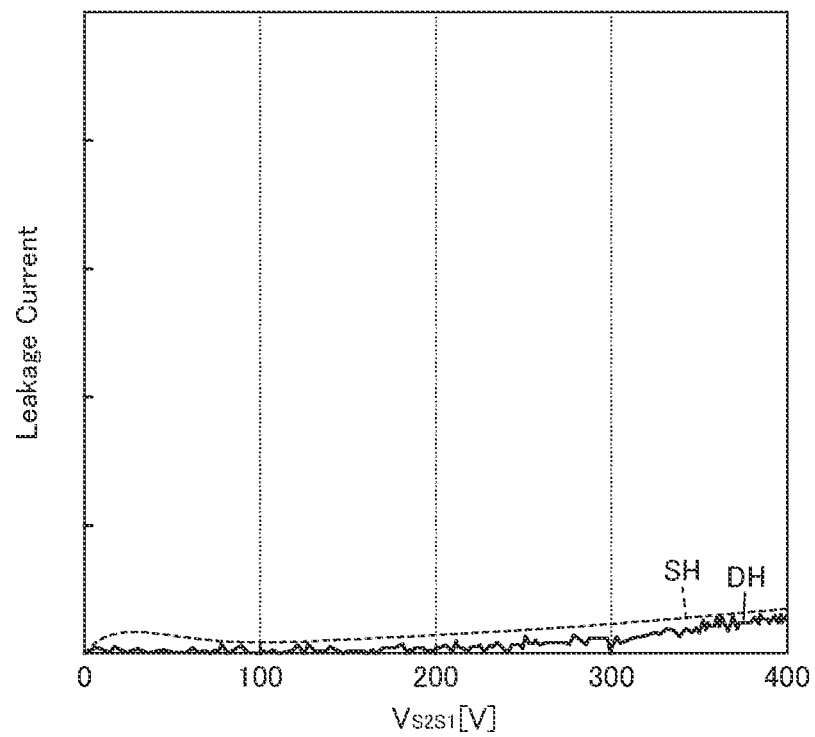
FIG. 4 is a graph showing respective current-voltage characteristics of the bidirectional switch element according to the first embodiment and the bidirectional switch element according to the comparative example.

FIG. 4 shows a relationship between $V_{S2S1}$ and leakage current (OFF-state leakage current) when the second source electrode S2 has a higher potential than the first source electrode S1 and the voltage between the second source electrode S2 and the first source electrode S1 is $V_{S2S1}$. In FIG. 4, the curve labeled "DH" represents measurement data acquired from an exemplary bidirectional switch element 1 according to the first embodiment having the double heterostructure, and the curve labeled "SH" represents measurement data acquired from an exemplary bidirectional switch element according to the comparative example having the single heterostructure described above. As can be seen from FIG. 4, when $V_{S2S1}$, is equal to or less than 400 V, the leakage current of the bidirectional switch element 1 according to the first embodiment is smaller than the leakage current of the bidirectional switch element according to the comparative example.

In the bidirectional switch element 1 according to the first embodiment, the second AlGaN layer 5 has an Al composition ratio less than 0.05 as described above. This allows the bidirectional switch element 1 according to the first embodiment to reduce the OFF-state leakage current.

Second Embodiment

Figure 5:
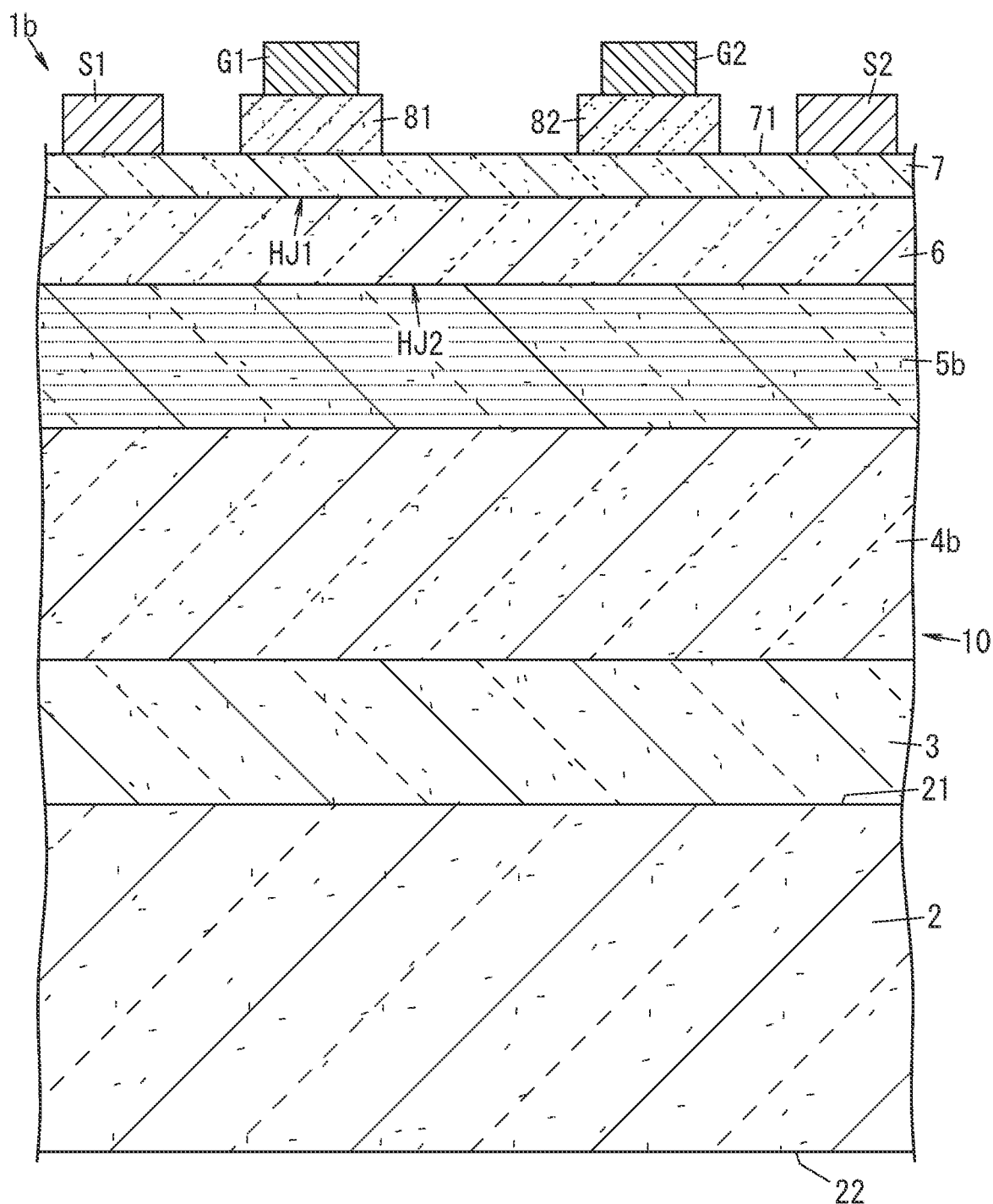
FIG. 5 is a cross-sectional view of a bidirectional switch element according to a second embodiment.

Next, a bidirectional switch element 1b according to a second embodiment will be described with reference to FIG. 5.

In the following description, any constituent element of the bidirectional switch element 1b according to the second embodiment, having the same function as a counterpart of the bidirectional switch element 1 according to the first embodiment (see FIG. 1) described above, will be designated by the same reference numeral as that counterpart's, and description thereof will be omitted herein.

The bidirectional switch element 1b according to the second embodiment includes a third AlGaN layer 4b and a second AlGaN layer 5b in place of the third AlGaN layer 4 and second AlGaN layer 5 of the bidirectional switch element 1 according to the first embodiment. In the bidirectional switch element 1b according to the second embodiment, the GaN layer 6, the first AlGaN layer 7, the first p-type AlGaN layer 81, the second p-type AlGaN layer 82, the second AlGaN layer 5b, and the third AlGaN layer 4b are examples of the $Al_zGa_{1-z}N$ layer (where $0 \leq z<1$), the $Al_bGa_{1-b}N$ layer (where $0<b<1$), the p-type $Al_{x1}Ga_{1-x1}N$ layer (where $0 \leq x1 \leq 1$), the p-type $Al_{x2}Ga_{1-x2}N$ layer (where $0 \leq x2 \leq 1$), the $Al_yGa_{1-y}N$ layer (where $0<y<1$ and $z<y<b$), and the $Al_wGa_{1-w}N$ layer (where $0<w<1$ and $z<w<b$), respectively.

The Al composition ratio of the third AlGaN layer 4b may be 0.05, for example. That is to say, the third AlGaN layer 4b may be an $Al_{0.05}Ga_{0.95}N$ layer. The third AlGaN layer 4b has a higher C concentration than the second AlGaN layer 5b. The third AlGaN layer 4b has a C concentration falling within the range from $1 \times 10^{19}$ cm$^{-3}$ to $1 \times 10^{19}$ cm$^{-3}$, for example.

The Al composition ratio of the second AlGaN layer 5b is smaller than the Al composition ratio of the third AlGaN layer 4b. In the second AlGaN layer 5b, as the distance from the third AlGaN layer 4b increases along the thickness of the second AlGaN layer 5b, the Al composition ratio thereof decreases. In other words, as the distance from the third AlGaN layer 4b increases, the bandgap energy of the second AlGaN layer 5b decreases. The shorter the distance to the GaN layer 6 is, the smaller the difference in bandgap energy between the second AlGaN layer 5b and the GaN layer 6 becomes. In this case, the second AlGaN layer 5b is a stack of three or more AlGaN layers with mutually different Al composition ratios, for example. For example, the second AlGaN layer 5b may be a stack of ten AlGaN layers with mutually different Al composition ratios. In that case, each of the ten AlGaN layers is one-tenth as thick as the second AlGaN layer 5b. In addition, as the distance from the GaN layer 6 increases along the thickness of the second AlGaN layer 5b, the Al composition ratios of the ten AlGaN layers increase at the step of 0.005 one layer after another. That is to say, the ten AlGaN layers consist of: an $Al_{0.005}Ga_{0.995}N$ layer; an $Al_{0.01}Ga_{0.99}N$ layer; an $Al_{0.015}Ga_{0.985}N$ layer; an $Al_{0.02}Ga_{0.98}N$ layer; an $Al_{0.025}Ga_{0.975}N$ layer; an $Al_{0.03}Ga_{0.97}N$ layer; an $Al_{0.035}Ga_{0.98}N$ layer; an $Al_{0.04}Ga_{0.96}N$ layer; an $Al_{0.045}Ga_{0.955}N$ layer; and an $Al_{0.05}Ga_{0.95}N$ layer, which are arranged in this order along the thickness of the second AlGaN layer 5b from the GaN layer 6 toward the third AlGaN layer 4b.

The bidirectional switch element 1b according to the second embodiment, as well as the bidirectional switch element 1 according to the first embodiment, may reduce the current collapse.

Figure 6:
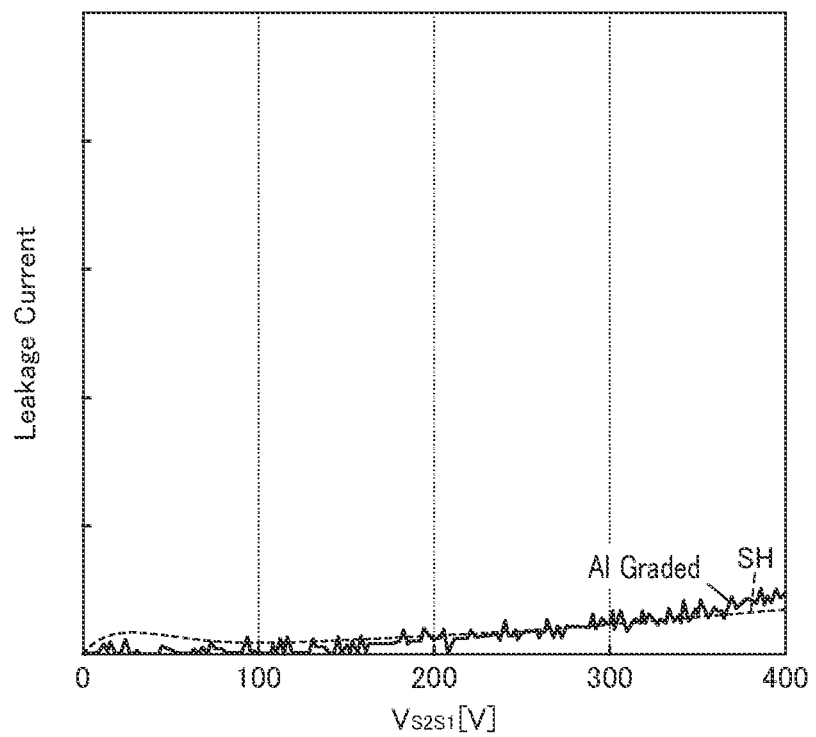
FIG. 6 is a graph showing respective current-voltage characteristics of the bidirectional switch element according to the second embodiment and the bidirectional switch element according to the comparative example.

FIG. 6 shows a relationship between $V_{S2S1}$ and a leakage current (OFF-state leakage current). In FIG. 6, the curve labeled "Al graded" represents measurement data acquired from an exemplary bidirectional switch element 1b according to the second embodiment, and the curve labeled "SH" represents measurement data acquired from an exemplary bidirectional switch element according to the comparative example having the single heterostructure described above. As can be seen from FIG. 6, when $V_{S2S1}$ is equal to or less than 250 V, the leakage current of the bidirectional switch element 1b according to the second embodiment is smaller than the OFF-state leakage current of the bidirectional switch element according to the comparative example.

Third Embodiment

Figure 7:
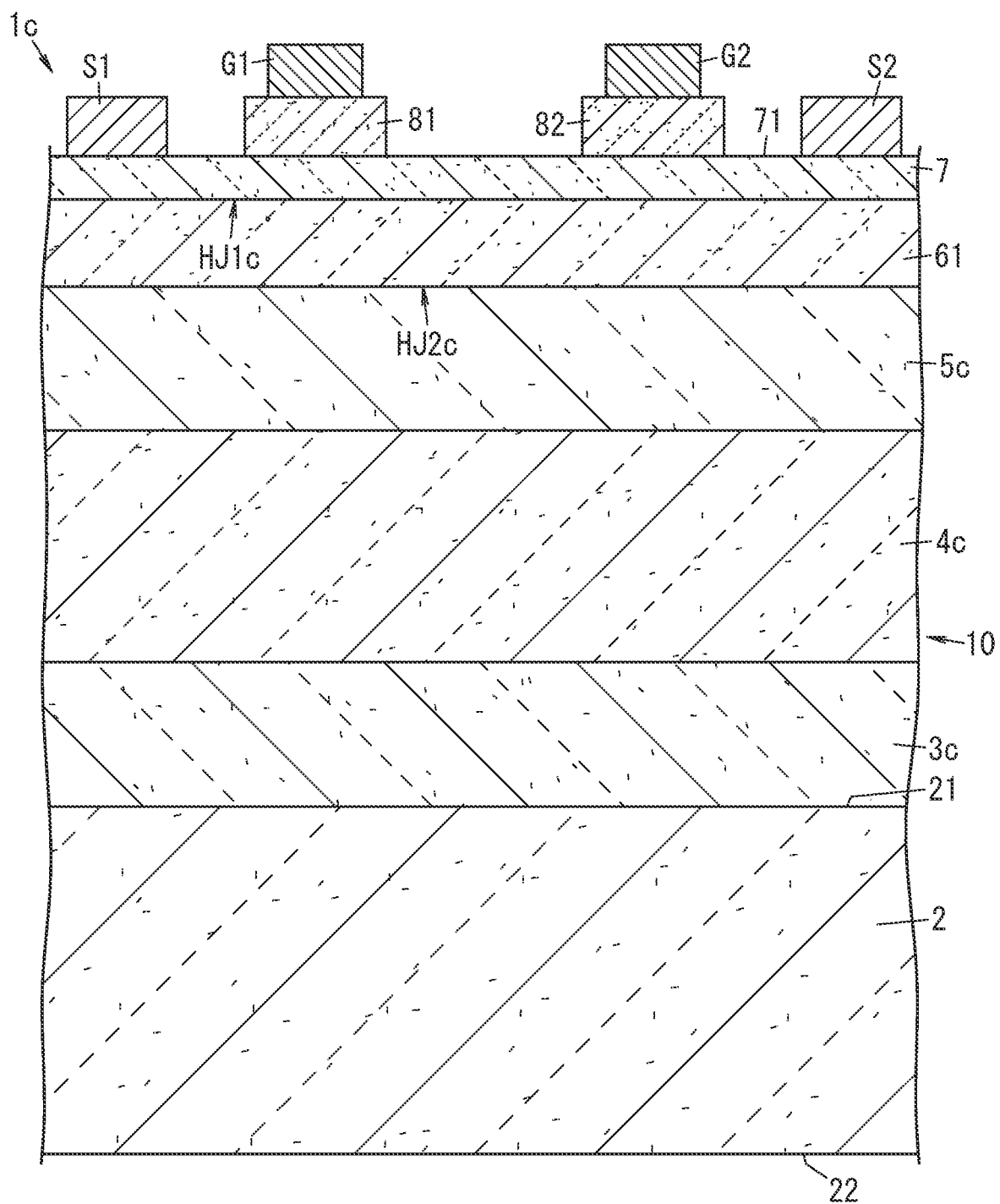
FIG. 7 is a cross-sectional view of a bidirectional switch element according to a third embodiment.

Next, a bidirectional switch element 1c according to a third embodiment will be described with reference to FIG. 7.

In the following description, any constituent element of the bidirectional switch element 1c according to the third embodiment, having the same function as a counterpart of the bidirectional switch element 1 according to the first embodiment (see FIG. 1) described above, will be designated by the same reference numeral as that counterpart's, and description thereof will be omitted herein.

The bidirectional switch element $1c$ according to the third embodiment includes a buffer layer $3c$, a third AlGaN layer $4c$, a second AlGaN layer $5c$, and fourth AlGaN layer $61$ instead of the buffer layer $3$, the third AlGaN layer $4$, the second AlGaN layer $5$, and the GaN layer $6$ of the bidirectional switch element $1$ according to the first embodiment. In the bidirectional switch element $1c$ according to the third embodiment, the fourth AlGaN layer $61$, the first AlGaN layer $7$, the first p-type AlGaN layer $81$, the second p-type AlGaN layer $82$, the second AlGaN layer $5c$, and the third AlGaN layer $4c$ are examples of the $Al_zGa_{1-z}N$ layer (where $0 \le z < 1$), the $Al_bGa_{1-b}N$ layer (where $0 < b < 1$), the p-type $Al_{x1}Ga_{1-x1}N$ layer (where $0 \le x1 \le 1$), the p-type $Al_{x2}Ga_{1-x2}N$ layer (where $0 \le x2 \le 1$), the $Al_yGa_{1-y}N$ layer (where $0 < y < 1$ and $z < y < b$), and the $Al_wGa_{1-w}N$ layer (where $0 < w < 1$ and $z < w < b$), respectively.

The fourth AlGaN layer $61$ is an undoped AlGaN layer. The undoped AlGaN layer serving as the fourth AlGaN layer $61$ may include Mg, H, Si. C, O, and other impurities to be inevitably contained therein during its growth. The fourth AlGaN layer $61$ may have a thickness of 100 nm to 700 nm, for example. The Al composition ratio z of the $Al_zGa_{1-z}N$ layer corresponding to the fourth AlGaN layer $61$ is smaller than the Al composition ratio b of the $Al_bGa_{1-b}N$ layer configured as the first AlGaN layer $7$, and is also smaller than the Al composition ratio y of the $Al_yGa_{1-y}N$ layer corresponding to the second AlGaN layer $5c$.

The first AlGaN layer $7$ forms, along with the fourth AlGaN layer $61$, a first heterojunction HJ$1c$. In the fourth AlGaN layer $61$, a two-dimensional electron gas has been generated in the vicinity of the first heterojunction HJ$1c$. The Al composition ratio of the undoped AlGaN layer serving as the first AlGaN layer $7$ may be 0.17, for example.

The second AlGaN layer $5c$ forms, along with the fourth AlGaN layer $61$, a second heterojunction HJ$2c$. The second AlGaN layer $5c$ is located opposite from the first AlGaN layer $7$ in the thickness direction defined for the fourth AlGaN layer $61$. In other words, the second AlGaN layer $5c$ faces the first AlGaN layer $7$ with the fourth AlGaN layer $61$ interposed between the second AlGaN layer $5c$ and the first AlGaN layer $7$. Thus, the bidirectional switch element $1$ has a double heterostructure including the first AlGaN layer $7$, the fourth AlGaN layer $61$, and the second AlGaN layer $5c$. The bandgap of each of the first AlGaN layer $7$ and the second AlGaN layer $5c$ is larger than the bandgap of the fourth AlGaN layer $61$.

The second AlGaN layer $5c$ is an undoped AlGaN layer. The undoped AlGaN layer serving as the second AlGaN layer $5c$ may include Mg, H, Si, C, O, and other impurities to be inevitably contained therein during its growth. The Al composition ratio of the second AlGaN layer $5c$ (i.e., the Al composition ratio y of an $Al_yGa_{1-y}N$ layer corresponding to the second AlGaN layer $5c$) may be 0.02, for example. That is to say, the second AlGaN layer $5c$ is an undoped $Al_{0.02}Ga_{0.98}N$ layer. The $Al_yGa_{1-y}N$ layer corresponding to the second AlGaN layer $5c$ may have a C concentration of $7 \times 10^{16}$ cm$^{-3}$. However, this numerical value is only an example and should not be construed as limiting. The C concentration of the $Al_yGa_{1-y}N$ layer is suitably equal to or less than $3 \times 10^{17}$ cm$^{-3}$. The second AlGaN layer $5c$ may have a thickness of 100 nm to 500 μm, for example.

The third AlGaN layer $4c$ is provided between the substrate $2$ and the second AlGaN layer $5c$. The Al composition ratio of the third AlGaN layer $4c$ (i.e., the Al composition ratio w of an $Al_wGa_{1-w}N$ layer corresponding to the third AlGaN layer $4c$) is suitably equal to the Al composition ratio y of the $Al_yGa_{1-y}N$ layer corresponding to the second AlGaN layer $5c$ and may be 0.02, for example. That is to say, the third AlGaN layer $4c$ is an $Al_{0.02}Ga_{0.98}N$ layer. The third AlGaN layer $4c$ has a higher C concentration than the second AlGaN layer $5c$. The third AlGaN layer $4c$ may have a C concentration falling within the range from $5 \times 10^{18}$ cm$^{-3}$ to $5 \times 10^{19}$ cm$^{-3}$ for example. The third AlGaN layer $4c$ is doped intentionally with C during its growth. More specifically, the C concentration of the third AlGaN layer $4c$ is made higher than the C concentration of the second AlGaN layer $5c$ by setting the condition for growing the third AlGaN layer $4c$ such that a growth rate of the third AlGaN layer $4c$ becomes higher than a growth rate of the second AlGaN layer $5c$. In this case, the third AlGaN layer $4c$ achieves a higher degree of electrical insulation than the second AlGaN layer $5c$ and functions as an electrical insulating layer. This reduces the chances of a current flowing through the fourth AlGaN layer $61$ in the thickness direction.

The buffer layer $3c$ is a C-doped GaN layer. The buffer layer $3c$ is doped with C intentionally during its growth. The C concentration of the buffer layer $3c$ is higher than the C concentration of the buffer layer $3$ configured as an undoped GaN layer. The buffer layer $3c$ may have a thickness of 100 nm to 3000 nm, for example.

In the bidirectional switch element $1c$ according to the third embodiment, the Al composition ratio y of the $Al_yGa_{1-y}N$ layer corresponding to the second AlGaN layer $5c$ is less than 0.05. This allows the bidirectional switch element $1c$ according to the third embodiment to reduce the OFF-state leakage current.

In addition, in the bidirectional switch element $1c$ according to the third embodiment, the Al composition ratio w of the $Al_wGa_{1-w}N$ layer corresponding to the third AlGaN layer $4c$ is less than 0.05. This allows the bidirectional switch element $1c$ according to the third embodiment to reduce the OFF-state leakage current.

Furthermore, in the bidirectional switch element $1c$ according to the third embodiment, the Al composition ratio y of the $Al_yGa_{1-y}N$ layer corresponding to the second AlGaN layer $5c$ is suitably less than 0.03 and the Al composition ratio w of the $Al_wGa_{1-w}N$ layer corresponding to the third AlGaN layer $4c$ is suitably less than 0.03. This allows the bidirectional switch element $1c$ according to the third embodiment to further reduce the OFF-state leakage current.

Note that the first to third embodiments described above are only exemplary ones of various embodiments of the present disclosure and should not be construed as limiting. Rather, the first to third exemplary embodiments described above may be readily modified in various manners depending on a design choice or any other factor without departing from the scope of the present disclosure.

For example, the relation between the respective thicknesses of the three or more AlGaN layers included in the second AlGaN layer $5b$ is not particularly limited. For example, the three or more AlGaN layers may have the same thickness or may have mutually different thicknesses.

Also, the Al composition ratio of the second AlGaN layer $5b$ does not have to vary stepwise but may also vary continuously.

Furthermore, the substrate $2$ does not have to be a silicon substrate but may also be a GaN substrate, an SiC substrate, or a sapphire substrate, for example.

In a first alternative example, each of the bidirectional switch elements $1$, $1a$, $1b$, $1c$ may include a first p-type GaN layer instead of the first p-type AlGaN layer 81 and a second p-type GaN layer instead of the second p-type AlGaN layer 82.

In a second alternative example, each of the bidirectional switch elements 1, 1a, 1b, 1c may include a first gate layer formed out of a p-type metal-oxide semiconductor layer instead of the first p-type AlGaN layer 81 and a second gate layer formed out of a p-type metal-oxide semiconductor layer instead of the second p-type AlGaN layer. The p-type metal-oxide semiconductor layer of the first and second gate layers may be an NiO layer, for example. The NiO layer may contain, as an impurity, at least one alkali metal selected from the group consisting of lithium (Li), sodium (Na), potassium (K), rubidium (Rb), and cesium (Cs). The NiO layer may also contain, for example, a transition metal such as silver (Ag) or copper (Cu) which becomes univalent when added as an impurity. When no voltage is applied to between the first gate electrode G1 and the first source electrode S1, the first gate layer forms a depletion layer in respective regions, located right under the first gate layer, of the first AlGaN layer 7 and the GaN layer 6. When no voltage is applied to between the second gate electrode G2 and the second source electrode S2, the second gate layer forms a depletion layer in respective regions, located right under the second gate layer, of the first AlGaN layer 7 and the GaN layer 6.

In a third alternative example, the bidirectional switch element 1 may include an InAlGaN layer instead of the second AlGaN layer 5. In that case, the InAlGaN layer may be configured as an undoped $In_{0.05}Al_{0.10}Ga_{0.85}N$ layer.

In a fourth alternative example, the bidirectional switch element 1 may include an InAlGaN layer instead of the third AlGaN layer 4. In that case, the InAlGaN layer replacing the third AlGaN layer 4 may be configured as an $In_{0.05}Al_{0.10}Ga_{0.85}N$ layer having a higher C concentration than the InAlGaN layer replacing the second AlGaN layer 5.

(Resume)

The embodiments and their variations described above are implementations of the following aspects of the present disclosure.

A bidirectional switch element (1; 1a; 1b; 1c) according to a first aspect includes: a substrate (2); an $Al_zGa_{1-z}N$ layer (where $0 \leq z < 1$); an $Al_bGa_{1-b}N$ layer (where $0 < b < 1$); a first source electrode (S1); a first gate electrode (G1); a second gate electrode (G2); a second source electrode (S2); a p-type $Al_{x1}Ga_{1-x1}N$ layer (where $0 \leq x1 \leq 1$); a p-type $Al_{x2}Ga_{1-x2}N$ layer (where $0 \leq x2 \leq 1$) an $Al_yGa_{1-y}N$ layer (where $0 < y < 1$ and $z < y < b$) and an $Al_wGa_{1-w}N$ layer (where $0 < w < 1$ and $z < w < b$). The $Al_zGa_{1-z}N$ layer (GaN layer 6; fourth AlGaN layer 61) is formed over the substrate (2). The $Al_bGa_{1-b}N$ layer (first AlGaN layer 7) is formed on the $Al_zGa_{1-z}N$ layer (GaN layer 6; fourth AlGaN layer 61). The first source electrode (S), the first gate electrode (G1), the second gate electrode (G2), and the second source electrode (S2) are formed on the $Al_bGa_{1-b}N$ layer (first AlGaN layer 7). The p-type $Al_{x1}Ga_{1-x1}N$ layer (first p-type AlGaN layer 81) is interposed between the first gate electrode (G1) and the $Al_bGa_{1-b}N$ layer (first AlGaN layer 7). The p-type $Al_{x2}Ga_{1-x2}N$ layer (second p-type AlGaN layer 82) is interposed between the second gate electrode (G2) and the $Al_bGa_{1-b}N$ layer (first AlGaN layer 7). The $Al_yGa_{1-y}N$ layer (second AlGaN layer 5; 5a; 5b; 5c) is interposed between the substrate (2) and the $Al_zGa_{1-z}N$ layer (GaN layer 6; fourth AlGaN layer 61). The $Al_wGa_{1-w}N$ layer (third AlGaN layer 4; 4a; 4b; 4c) is interposed between the substrate (2) and the $Al_yGa_{1-y}N$ layer (second AlGaN layer 5; 5a; 5b; 5c) and has a higher C concentration than the $Al_yGa_{1-y}N$ layer (second AlGaN layer 5; 5a; 5b; 5c).

The bidirectional switch element (1; 1a; 1b; 1c) according to the first aspect may reduce the current collapse.

In a bidirectional switch element (1; 1c) according to a second aspect, which may be implemented in conjunction with the first aspect, an Al composition ratio (y) of the $Al_yGa_{1-y}N$ layer (second AlGaN layer 5; 5c) is less than 0.05.

The bidirectional switch element (1; 1c) according to the second aspect may reduce an OFF-state leakage current.

In a bidirectional switch element (1b) according to a third aspect, which may be implemented in conjunction with the first or second aspect, an Al composition ratio (y) of the $Al_yGa_{1-y}N$ layer (second AlGaN layer 5b) is smaller than an Al composition ratio (w) of the $Al_wGa_{1-w}N$ layer (third AlGaN layer 4b). In the $Al_yGa_{1-y}N$ layer (second AlGaN layer 5b), the Al composition ratio (y) decreases as a distance from the $Al_wGa_{1-w}N$ layer (third AlGaN layer 4b) increases along thickness of the $Al_yGa_{1-y}N$ layer (second AlGaN layer 5b).

The bidirectional switch element (1b) according to the third aspect may reduce an OFF-state leakage current.

In a bidirectional switch element (1b) according to a fourth aspect, which may be implemented in conjunction with any one of the first to third aspects, the $Al_yGa_{1-y}N$ layer (second AlGaN layer 5b) is a stack of three or more AlGaN layers having mutually different Al composition ratios.

The bidirectional switch element (1b) according to the fourth aspect may reduce generation of an OFF-state leakage current.

In a bidirectional switch element (1c) according to a fifth aspect, which may be implemented in conjunction with the second aspect, an Al composition ratio (w) of the $Al_wGa_{1-w}N$ layer (third AlGaN layer 4c) is less than 0.05.

The bidirectional switch element (1c) according to the fifth aspect may further reduce an OFF-state leakage current.

In a bidirectional switch element (1c) according to a sixth aspect, which may be implemented in conjunction with the fifth aspect, the Al composition ratio (y) of the $Al_yGa_{1-y}N$ layer (second AlGaN layer 5c) is less than 0.03, and the Al composition ratio (w) of the $Al_wGa_{1-w}N$ layer (third AlGaN layer 4c) is less than 0.03.

The bidirectional switch element (1c) according to the sixth aspect may further reduce the OFF-state leakage current.

A bidirectional switch element (1; 1a; 1b; 1c) according to a seventh aspect, which may be implemented in conjunction with any one of the first to sixth aspects, is used with the substrate (2) electrically insulated from all of the first source electrode (S), the second source electrode (S2), the first gate electrode (G1), and the second gate electrode (G2).

The bidirectional switch element (1; 1a; 1b; 1c) according to the seventh aspect may reduce a current collapse without using the substrate (2) in a grounded state.

In a bidirectional switch element (1; 1a; 1b; 1c) according to an eighth aspect, which may be implemented in conjunction with any one of the first to seventh aspects, the third AlGaN layer (4; 4a; 4b; 4c) has a greater thickness than the second AlGaN layer (5; 5a; 5b; 5c).

The bidirectional switch element (1; 1a; 1b; 1c) according to the eighth aspect may increase breakdown voltage thereof.

REFERENCE SIGNS LIST 1, 1a, 1b, 1c Bidirectional Switch Element
2 Substrate
4, 4a, 4b, 4c Third AlGaN Layer ($Al_wGa_{1-w}N$ Layer)
5, 5a, 5b, 5c Second AlGaN Layer ($Al_yGa_{1-y}N$ Layer)
6 GaN Layer ($Al_zGa_{1-z}N$ Layer)
61 Fourth AlGaN Layer ($Al_zGa_{1-z}N$ Layer)
7 First AlGaN Layer ($Al_bGa_{1-b}N$ Layer)
81 First p-type AlGaN Layer (p-type $Al_{x1}Ga_{1-x1}N$ Layer)
82 Second p-type AlGaN Layer (p-type $Al_{x2}Ga_{1-x2}N$ Layer)
G1 First Gate Electrode
G2 Second Gate Electrode
S1 First Source Electrode
S2 Second Source Electrode

The invention claimed is:

1. A bidirectional switch element comprising:
   a substrate;
   an $Al_zGa_{1-z}N$ layer formed over the substrate, where $0 \leq z < 1$;
   an $Al_bGa_{1-b}N$ layer formed on the $Al_zGa_{1-z}N$ layer, where $0 < b < 1$;
   a first source electrode, a first gate electrode, a second gate electrode, and a second source electrode, which are formed on the $Al_bGa_{1-b}N$ layer;
   a p-type $Al_{x1}Ga_{1-x1}N$ layer interposed between the first gate electrode and the $Al_bGa_{1-b}N$ layer, where $0 \leq x1 \leq 1$;
   a p-type $Al_{x2}Ga_{1-x2}N$ layer interposed between the second gate electrode and the $Al_bGa_{1-b}N$ layer, where $0 \leq x2 \leq 1$;
   an $Al_yGa_{1-y}N$ layer interposed between the substrate and the $Al_zGa_{1-z}N$ layer, where $0 < y < 1$ and $z < y < b$; and
   an $Al_wGa_{1-w}N$ layer interposed between the substrate and the $Al_yGa_{1-y}N$ layer and having a higher C concentration than the $Al_yGa_{1-y}N$ layer, where $0 < w < 1$ and $z < w < b$.

2. The bidirectional switch element of claim 1, wherein an Al composition ratio y of the $Al_yGa_{1-y}N$ layer is less than 0.05.

3. The bidirectional switch element of claim 1, wherein an Al composition ratio y of the $Al_yGa_{1-y}N$ layer is smaller than an Al composition ratio w of the $Al_wGa_{1-w}N$ layer, and
   in the $Al_yGa_{1-y}N$ layer, the Al composition ratio y decreases as a distance from the $Al_wGa_{1-w}N$ layer increases along thickness of the $Al_yGa_{1-y}N$ layer.

4. The bidirectional switch element of claim 1, wherein the $Al_yGa_{1-y}N$ layer is a stack of three or more AlGaN layers having mutually different Al composition ratios.

5. The bidirectional switch element of claim 2, wherein an Al composition ratio w of the $Al_wGa_{1-w}N$ layer is less than 0.05.

6. The bidirectional switch element of claim 5, wherein the Al composition ratio y of the $Al_yGa_{1-y}N$ layer is less than 0.03, and the Al composition ratio w of the $Al_wGa_{1-w}N$ layer is less than 0.03.

7. The bidirectional switch element of claim 1, wherein the bidirectional switch element is used with the substrate electrically insulated from all of the first source electrode, the second source electrode, the first gate electrode, and the second gate electrode.

8. The bidirectional switch element of claim 1, wherein the $Al_wGa_{1-w}N$ layer has greater thickness than the $Al_yGa_{1-y}N$ layer.

9. The bidirectional switch element of claim 2, wherein an Al composition ratio y of the $Al_yGa_{1-y}N$ layer is smaller than an Al composition ratio w of the $Al_wGa_{1-w}N$ layer, and
   in the $Al_yGa_{1-y}N$ layer, the Al composition ratio y decreases as a distance from the $Al_wGa_{1-w}N$ layer increases along thickness of the $Al_yGa_{1-y}N$ layer.

10. The bidirectional switch element of claim 2, wherein the $Al_yGa_{1-y}N$ layer is a stack of three or more AlGaN layers having mutually different Al composition ratios.

11. The bidirectional switch element of claim 3, wherein the $Al_yGa_{1-y}N$ layer is a stack of three or more AlGaN layers having mutually different Al composition ratios.

12. The bidirectional switch element of claim 2, wherein the bidirectional switch element is used with the substrate electrically insulated from all of the first source electrode, the second source electrode, the first gate electrode, and the second gate electrode.

13. The bidirectional switch element of claim 3, wherein the bidirectional switch element is used with the substrate electrically insulated from all of the first source electrode, the second source electrode, the first gate electrode, and the second gate electrode.

14. The bidirectional switch element of claim 4, wherein the bidirectional switch element is used with the substrate electrically insulated from all of the first source electrode, the second source electrode, the first gate electrode, and the second gate electrode.

15. The bidirectional switch element of claim 5, wherein the bidirectional switch element is used with the substrate electrically insulated from all of the first source electrode, the second source electrode, the first gate electrode, and the second gate electrode.

16. The bidirectional switch element of claim 6, wherein the bidirectional switch element is used with the substrate electrically insulated from all of the first source electrode, the second source electrode, the first gate electrode, and the second gate electrode.

17. The bidirectional switch element of claim 2, wherein the $Al_wGa_{1-w}N$ layer has greater thickness than the $Al_yGa_{1-y}N$ layer.

18. The bidirectional switch element of claim 3, wherein the $Al_wGa_{1-w}N$ layer has greater thickness than the $Al_yGa_{1-y}N$ layer.

* * * * *